United States Patent
Elliott et al.

(10) Patent No.: US 12,288,702 B2
(45) Date of Patent: Apr. 29, 2025

(54) SEMICONDUCTOR WAFER MASS METROLOGY APPARATUS AND SEMICONDUCTOR WAFER MASS METROLOGY METHOD

(71) Applicant: METRYX LIMITED, Bristol (GB)

(72) Inventors: Gregor Elliott, Bristol (GB); Eric Tonnis, Bristol (GB)

(73) Assignee: LAM RESEARCH CORPORATION, Fremont, CA (US)

( * ) Notice: Subject to any disclaimer, the term of this patent is extended or adjusted under 35 U.S.C. 154(b) by 1182 days.

(21) Appl. No.: 17/048,489

(22) PCT Filed: Apr. 3, 2019

(86) PCT No.: PCT/EP2019/058388
§ 371 (c)(1),
(2) Date: Oct. 16, 2020

(87) PCT Pub. No.: WO2019/201603
PCT Pub. Date: Oct. 24, 2019

(65) Prior Publication Data
US 2021/0175102 A1    Jun. 10, 2021

(30) Foreign Application Priority Data
Apr. 19, 2018 (GB) ..................... 1806377

(51) Int. Cl.
*H01L 21/67* (2006.01)
*G01N 25/72* (2006.01)

(52) U.S. Cl.
CPC ....... *H01L 21/67248* (2013.01); *G01N 25/72* (2013.01); *H01L 21/67103* (2013.01); *H01L 21/67109* (2013.01)

(58) Field of Classification Search
CPC ........ H01L 21/67248; H01L 21/67103; H01L 21/67109; H01L 21/67748; H01L 21/67253; G01N 25/72; G01N 5/00
(Continued)

(56) References Cited

U.S. PATENT DOCUMENTS 6,790,376 B1    9/2004  Markle et al.
8,319,196 B2 *  11/2012 England ............ H01L 21/67213
                                              118/723 CB
(Continued)

FOREIGN PATENT DOCUMENTS

EP          3078057 A1      10/2016
JP       2002506279 A  *   2/2002
(Continued)

OTHER PUBLICATIONS

English translation of JP 2017515148, Jun. 2017. (Year: 2017).*
(Continued)

*Primary Examiner* — Michael P Nghiem

(57) ABSTRACT

A semiconductor wafer mass metrology apparatus comprising: a measurement chamber for measuring the weight and/or the mass of a semiconductor wafer; a first temperature changing part for changing a temperature of the semiconductor wafer before the semiconductor wafer is transported into the measurement chamber; and a first temperature sensor for sensing a first temperature, wherein the first temperature is: a temperature of the first temperature changing part; or a temperature of the semiconductor wafer when the semiconductor wafer is on the first temperature changing part, or when the semiconductor wafer leaves the first temperature changing part.

21 Claims, 6 Drawing Sheets

(58) Field of Classification Search
USPC .......................................................... 702/130
See application file for complete search history.

(56) References Cited

U.S. PATENT DOCUMENTS

| | | | |
|---|---|---|---|
| 9,111,971 | B2 | 8/2015 | Shavit et al. |
| 9,818,658 | B2 | 11/2017 | Wilby |
| 2006/0095228 | A1 | 5/2006 | Wilby |
| 2006/0286807 | A1 | 12/2006 | Hwang et al. |
| 2008/0032426 | A1* | 2/2008 | Michaelson ............ H01L 22/12 257/E21.53 |
| 2008/0044938 | A1* | 2/2008 | England ............ H01L 21/67248 438/51 |
| 2012/0107757 | A1 | 5/2012 | Reitinger |
| 2014/0027437 | A1 | 1/2014 | Shavit et al. |
| 2017/0005019 | A1 | 1/2017 | Wilby et al. |
| 2017/0109646 | A1* | 4/2017 | David ................ G03F 7/70625 |
| 2019/0252294 | A1 | 8/2019 | Hsieh et al. |
| 2022/0034708 | A1* | 2/2022 | Elliott .................... G01G 23/00 |

FOREIGN PATENT DOCUMENTS

| | | | |
|---|---|---|---|
| JP | 2010540951 A | | 12/2010 |
| JP | 2010540952 A | | 12/2010 |
| JP | 2014039001 A | | 2/2014 |
| JP | 2017507474 A | | 3/2017 |
| JP | 2017515148 A | * | 6/2017 |
| KR | 20010046063 A | | 6/2001 |
| KR | 20170003683 A | | 1/2017 |
| TW | 201523737 A | | 6/2015 |
| TW | 201714261 A | | 4/2017 |
| WO | WO-200203449 A2 | | 1/2002 |
| WO | WO-2015082874 A1 | | 6/2015 |
| WO | WO-2015175339 A1 | | 11/2015 |

OTHER PUBLICATIONS

English translation of JP 2002506279, Feb. 26, 2002. (Year: 2002).*
GB Search Report of the Intellectual Property Office issued in Application No. GB1806377.6, dated Jul. 26, 2018.
International Search Report and Written Opinion of the ISA issued in PCT/EP2019/058388, mailed Jun. 21, 2019; ISA/EP.
Translation of Office Action corresponding to Korean Application No. 10-2020-7033146 dated Dec. 2, 2022, 12 pages.
Translation of Notification of Examination Opinions corresponding to Taiwanese Application No. 108113138 dated Oct. 4, 2022, 12 pages.
10-2020-555869_OA Translation; 3 Pages.
Translationa of Korean Prior Art Search Report dated Mar. 29, 2022 corresponding to KR 10-2020-7033146, 11 pages.

* cited by examiner

SEMICONDUCTOR WAFER MASS METROLOGY APPARATUS AND SEMICONDUCTOR WAFER MASS METROLOGY METHOD

CROSS-REFERENCE TO RELATED APPLICATIONS

This application is a U.S. National Phase Application under 35 U.S.C. 371 of International Application No. PCT/EP2019/058388, filed on Apr. 3, 2019, which claims the benefit of Great Britain Patent Application No. GB 1806377.6, filed on Apr. 19, 2018. The entire disclosures of the applications referenced above are incorporated herein by reference.

FIELD OF THE INVENTION

The present invention relates to a semiconductor wafer mass metrology apparatus and a semiconductor wafer mass metrology method.

In particular, the present invention relates to a semiconductor wafer mass metrology apparatus and a semiconductor wafer mass metrology method in which a temperature of a temperature changing part that is used to change a temperature of a semiconductor wafer before it is transported into a measurement area, or a temperature of the semiconductor wafer whose temperature is changed by the temperature changing part, is measured.

BACKGROUND OF THE INVENTION

Microelectronic devices are fabricated on semiconductor (e.g. silicon) wafers using a variety of techniques, e.g. including deposition techniques (CVD, PECVD, PVD, etc.) and removal techniques (e.g. chemical etching, CMP, etc.). Semiconductor wafers may be further treated in ways that alter their mass, e.g. by cleaning, ion implantation, lithography and the like.

Depending on the device being manufactured, each semiconductor wafer may be passed sequentially through hundreds of different processing steps to build up and/or to remove the layers and materials necessary for its ultimate operation. In effect, each semiconductor wafer is passed down a production line.

The cost and complexity of the processing steps required to produce a completed silicon wafer, together with the time that it takes to reach the end of the production line where its operation can be properly assessed, has led to a desire to monitor the operation of the equipment on the production line and the quality of the wafers being processed throughout processing, so that confidence in the performance and yield of the final wafers may be assured.

Wafer treatment techniques typically cause a change in mass of the semiconductor wafer (e.g. at or on the surface of the semiconductor wafer or in the bulk of the semiconductor wafer). The configuration of the changes to the semiconductor wafer are often vital to the functioning of the device, so it is desirable for quality control purposes to assess wafers during production in order to determine whether they have the correct configuration.

Measuring the change in mass of a wafer either side of a processing step is an attractive method for implementing product wafer metrology. It is relatively low cost, high speed and can accommodate different wafer circuitry patterns automatically. In addition, it can often provide results of higher accuracy than alternative techniques. For example, on many typical materials, thicknesses of material layers can be resolved down to an atomic scale. The wafer in question is weighed before and after the processing step of interest. The change in mass is correlated to the performance of the production equipment and/or the desired properties of the wafer.

Processing steps carried out on semiconductor wafers can cause very small changes in the mass of the semiconductor wafer, which it may be desirable to measure with high accuracy. For example, removing a small amount of material from the surface of the semiconductor wafer may reduce the mass of the semiconductor wafer by a few milligrams, and it may be desirable to measure this change with a resolution of the order of ±100 µg or better.

At these high levels of measurement accuracy, errors in the measurement output caused by temperature variations in the semiconductor wafers being measured or in the temperature of the measurement balance may become significant. For example, a temperature difference of approximately 0.005° C. between the semiconductor wafer and the measurement balance or enclosure may cause an error of approximately 5 µg in the determined mass (or change in mass) of the semiconductor wafer. Variations in temperature between different parts of the measurement apparatus (i.e. temperature non-uniformity), e.g. caused by a heat load from semiconductor wafers being measured using the measurement apparatus, will cause errors in the measurement output. In addition, if the semiconductor wafers have a higher temperature than a measurement enclosure of the measurement apparatus, air currents (e.g. convection currents) may be generated in the air in the measurement enclosure, which may affect the measurement output. In addition, the air in the measurement enclosure may be heated, changing its density and pressure and therefore the buoyancy force exerted on the semiconductor wafer by the air. This may also affect the measurement output. The magnitudes of these effects are generally considered insignificant and are ignored (or not detected) in lower accuracy mass measurements, for example measurements performed with a resolution of the order of milligrams.

Temperature changes occurring slowly over a relatively long period of time (e.g. of the order of hours) may be essentially accounted for by periodically calibrating the measurement apparatus, or may be essentially subtracted out by performing comparative measurements. However, temperature changes occurring more rapidly (e.g. due to a high heat load from a plurality of semiconductor wafers) may be more difficult to account for or to subtract out in the same way.

The temperature of a semiconductor wafer immediately after it has been processed in a production line may be 400-500° C. or higher. After processing the semiconductor wafer may be loaded into a Front Opening Unified Pod (FOUP) together with other recently processed semiconductor wafers (e.g. 25 in total) for transportation between different processing locations of the production line. When the FOUP arrives at a weighing device for weighing the semiconductor wafers, the temperature of the semiconductor wafers may still be high, for example 70° C. or higher. In contrast, the temperature of the weighing device may be approximately 20° C. Therefore, there may be a significant temperature difference between the semiconductor wafers and the weighing device. As discussed above, a significant temperature difference between the semiconductor wafer and the weighing device may cause errors in the weight measurements. For high accuracy weight measurements, even errors caused by very small temperature differences (e.g. less than 1° C., for example 0.001° C.) may be significant.

WO02/03449 describes a semiconductor wafer mass metrology method that aims to reduce errors in the measurement output caused by temperature variations in the measurement balance or of the semiconductor wafers being measured. In the method described in WO02/03449 a semiconductor wafer is removed from a Front Opening Unified Pod (FOUP) and placed on a passive thermal transfer plate that is thermally coupled to a chamber of the weighing apparatus before it is placed on a measurement area of the weighing apparatus. The passive thermal transfer plate equalises the temperature of the semiconductor wafer to the temperature of the chamber to within ±0.1° C. This temperature equalisation may reduce the potential errors discussed above when the semiconductor wafer is loaded into the measurement chamber. This method therefore may make the measurement output more accurate, relative to a method in which there is no temperature equalisation of the semiconductor wafer before taking the measurement.

WO2015/082874 discloses that there may a significant heat load on the chamber of the weighing apparatus in the method described in WO02/03449. For example, when performing a sequence of weight measurements on a sequence of semiconductor wafers in which the semiconductor wafers are cooled from approximately 70° C. to approximately 20° C. by the thermal transfer plate before performing the weight measurements, there may be a heat load of the order of tens of Watts on the chamber of the weighing apparatus, for example a heat load of approximately 50W-100W, e.g. 75W (assuming approximately 60 wafers per hour).

This heat load may cause the temperature of the weighing apparatus (e.g. the temperature of a balance of the weighing apparatus) to increase or to become non-uniform, which may cause corresponding errors in the weight measurements performed by the weighing apparatus, as discussed above. In addition, this heat load can cause air currents (e.g. convection currents) and changes in the air density and pressure around the balance, which can also cause corresponding errors in the weight measurements performed by the weighing apparatus. As a consequence, the accuracy of the weighing apparatus may be reduced. These effects may be significant when performing high accuracy measurements, for example measurements with an accuracy of around ±100 µg or better. For example, a change in the measurement output may be observed when the first (or a single isolated) semiconductor wafer is measured using the weighing apparatus, due to the convection currents and changes in air density caused by the temperature difference between that semiconductor wafer and the weighing apparatus.

WO2015/082874 discloses removing the bulk of the heat load from the semiconductor wafer before using the thermal transfer plate to equalise the temperature of the semiconductor wafer to the temperature of the weighing apparatus, to reduce the heat load on the weighing apparatus.

Therefore, the temperature of the thermal transfer plate should not change significantly during the temperature equalisation, and the temperature of the semiconductor wafer will therefore be more accurately/precisely equalised to the desired temperature (i.e. the original temperature of the thermal transfer plate).

In an embodiment disclosed in WO2015/082874, the bulk of the heat load is removed from the semiconductor wafers using an active thermal transfer plate and then the temperature of the semiconductor wafers is equalised to the temperature of the measurement chamber using a passive thermal transfer plate that is mounted on an upper surface of the measurement chamber and in thermal equilibrium with the measurement chamber. In a specific example disclosed in WO2015/082874, the thermal transfer plate is an Aluminium plate bolted to the measurement chamber using bolts having a high thermal conductivity.

SUMMARY

The present inventors have realised that in the arrangements discussed above it is possible for the temperature of the thermal transfer plate, and therefore the temperature of the semiconductor wafer after it has been cooled by the thermal transfer plate, to differ from the temperature of the measurement chamber, therefore causing the various measurement errors discussed above when a measurement is performed on the semiconductor wafer. This is due to a high thermal load on the thermal transfer plate when cooling a number of hot semiconductor wafers.

The present inventors have realised that the accuracy of semiconductor wafer mass metrology can be improved by measuring a temperature of a temperature changing part that is used to change a temperature of a semiconductor wafer before the semiconductor wafer is transported into a measurement chamber, or a temperature of the semiconductor wafer whose temperature is changed by the temperature changing part.

Therefore, at its most general the present invention provides a semiconductor wafer mass metrology apparatus or method in which a temperature of a temperature changing part that is used to change a temperature of a semiconductor wafer before the semiconductor wafer is transported into a measurement chamber, or a temperature of the semiconductor wafer whose temperature is changed by the temperature changing part, is measured.

As discussed in the following, there are various different ways in which the measured temperature can be used to improve the accuracy of semiconductor wafer mass metrology.

According to a first aspect of the present invention there is provided a semiconductor wafer mass metrology apparatus comprising:

a measurement chamber for measuring the weight and/or the mass of a semiconductor wafer;

a first temperature changing part for changing a temperature of the semiconductor wafer before the semiconductor wafer is transported into the measurement chamber; and a first temperature sensor for sensing a first temperature, wherein the first temperature is:

a temperature of the first temperature changing part; or a temperature of the semiconductor wafer when the semiconductor wafer is on the first temperature changing part, or when the semiconductor wafer leaves the first temperature changing part.

Thus, in the first aspect of the present invention the temperature of the first temperature changing part, or the temperature of the semiconductor wafer when it is on the first temperature changing part or when it leaves the first temperature changing part, is measured.

The apparatus according to the first aspect of the present invention may optionally comprise any one, or, where combinable, any combination of the following optional features.

Typically, the first temperature changing part will be for reducing the temperature of the semiconductor wafer. In other words, the first temperature changing part is typically a cooling part. However, alternatively the first temperature changing part may be a heating part that is configured to heat the semiconductor wafer to increase the temperature of the semiconductor wafer.

Typically, the semiconductor wafer will be transported into the measurement chamber immediately after leaving the first temperature changing part, for example without any intermediate steps, and in particular without any intentional further active or passive cooling of the semiconductor wafer. This may be achieved by the apparatus having a suitably configured transport mechanism. For example, a transporter may be provided that is configured to transport a semiconductor wafer directly from the first temperature changing part into the measurement chamber.

The semiconductor wafer may be considered to have left the first temperature changing part when there is no physical contact between the semiconductor wafer and the first temperature changing part.

The measurement chamber may partially or fully enclose a measurement area.

The measurement area may comprise a weighing device, for example a load cell, for outputting information indicative of a mass and/or weight of the semiconductor wafer.

The first temperature changing part may be for passively cooling the semiconductor wafer. Passively cooling means that the first temperature changing part does not include any powered cooling means/device, such as a thermoelectric cooling device, such as a Peltier. Alternatively, the first temperature changing part may be for actively cooling the semiconductor wafer, for example using a powered cooling means/device, such as a thermoelectric cooling device, such as a Peltier.

Alternatively, as discussed above the first temperature changing part may alternatively be for warming the semiconductor wafer, either passively or actively.

The apparatus may further comprise a second temperature changing part for actively cooling the semiconductor wafer. Active cooling means that the second temperature changing part includes a powered cooling device, such as a thermoelectric cooling device, such as a Peltier.

Alternatively, the second temperature changing part may be for actively heating the semiconductor wafer, for example using a powered heater or heating element.

Alternatively, the apparatus may further comprise a second temperature changing part for passively cooling the semiconductor wafer. For example, the second temperature changing part may comprise an air cooled passive thermal transfer plate. Air cooling of the passive thermal transfer plate may be achieved by blowing air over the passive thermal transfer plate, for example using a fan.

Alternatively, the second temperature changing part may be for passively heating the semiconductor wafer.

Alternatively, the second temperature changing part may be configured to change a temperature of the semiconductor wafer by bringing the semiconductor wafer into thermal equilibrium with a flow of air over or through the second temperature changing part.

The second temperature changing device may be used to remove a bulk of a heat load from the semiconductor wafer before the semiconductor wafer is cooled by the first temperature changing device. The thermal load on the first temperature changing device from cooling the semiconductor wafers is therefore reduced.

Alternatively, the second temperature changing device may cool the semiconductor wafer to a temperature slightly below the temperature of the first temperature changing device, and the first temperature changing device may then heat the semiconductor wafer.

Alternatively, the second temperature changing device may be use to add a bulk heat load to the semiconductor wafer before the semiconductor wafer is heated or cooled by the first temperature changing device. Again, the thermal load on the first temperature changing device from heating or cooling the semiconductor wafers is therefore reduced.

The reduced heat load on the first temperature changing device means that any temperature change of the first temperature changing device as a consequence of the heat load is reduced. As such, the temperature of the semiconductor wafer can be more accurately controlled using the first temperature changing device. This may allow the temperature of the semiconductor wafer in the measurement chamber and/or the temperature (and/or temperature uniformity) of the measurement chamber to be controlled more precisely or more accurately than is possible without the second temperature changing part. As a consequence, the semiconductor wafer mass metrology may be performed more accurately.

For example, where the temperature of the semiconductor wafer is controlled to be substantially the same as the temperature of the measurement chamber (which is typically the case), any errors caused by temperature differences may be minimised as the temperature difference may be minimised.

The first temperature changing part and the second temperature changing part may be thermally insulated from each other, e.g. separated by a thermal insulator such as an air gap or a layer of thermally insulating material.

Alternatively, the second temperature changing part may form part of a separate device to the apparatus of the first aspect of the present invention. The second temperature changing part may therefore be provided in combination with the apparatus of the first aspect.

A temperature changing part may be any device that can be used to increase or to decrease (i.e. to change) the temperature of the semiconductor wafer, e.g. a heating unit/heater or a cooling unit/cooler.

The terms "first" and "second" used in relation to the first temperature changing device and the second temperature changing device are merely used to differentiate between the temperature changing devices, and do not indicate an order of the temperature changing devices or the temperature changes that they cause to a semiconductor wafer. In fact, as is clear from the discussion below, when the second temperature changing device is present, the temperature of the semiconductor wafer is changed using the second temperature changing device initially, and then the temperature of the semiconductor wafer is further changed using the first temperature changing device. In such an arrangement, the second temperature change therefore occurs before the first temperature change.

The second temperature changing part may cause a second temperature change in the temperature of the semiconductor wafer that comprises at least 80%, or at least 90%, or at least 95%, or at least 99% of the sum of the magnitudes of the second temperature change and a first temperature change in the temperature of the semiconductor wafer caused by the first temperature changing part. Therefore, the bulk of the heat load of the semiconductor wafer may be removed from, or added to, the semiconductor wafer by the second temperature changing part. As a consequence, the heat load on the first temperature changing part when it is used to cause the first change in the temperature of the semiconductor wafer is reduced, and the temperature of the semiconductor wafer can be more accurately/precisely matched to the desired temperature.

Causing the second change in the temperature of the semiconductor wafer may comprise changing the temperature of the semiconductor wafer to be within ±3° C., or within ±2° C., or within ±1° C., or within ±0.1° C. of a predetermined measurement temperature (e.g. a temperature of the measurement chamber). In other words, the second change in the temperature of the semiconductor wafer may bring the temperature of the semiconductor wafer close (i.e. within a few ° C.) to the predetermined measurement temperature, so that the first temperature changing part only needs to cause a small change in the temperature of the semiconductor wafer (corresponding to adding or removing a small heat load from the semiconductor wafer).

In the present invention, the temperature of the first temperature changing part may be measured when the semiconductor wafer is on the first temperature changing part, or when the semiconductor wafer leaves the first temperature changing part.

Monitoring the temperature of the first temperature changing part when the semiconductor wafer is on the first temperature changing part can provide information about a difference in temperature between the temperature changing part and the semiconductor wafer when the semiconductor wafer first arrives at the first temperature changing part.

For example, the first temperature sensor may be configured to detect a change in the temperature of the first temperature changing part caused by the semiconductor wafer, and/or a maximum temperature of the first temperature changing part caused by the semiconductor wafer. In particular, when there is a difference between the temperature of the semiconductor wafer and the temperature of the first temperature changing part when the semiconductor wafer is loaded on the first temperature changing part, there may be an initial spike in the temperature of the first temperature changing part. This initial spike may be detected and/or measured in the present invention and may provide information about the incoming wafer temperature, or about the difference between the incoming wafer temperature and the temperature of the first temperature changing part.

The temperature of the semiconductor wafer when it leaves the first temperature changing part can provide information about a difference in temperature between the semiconductor wafer and the measurement chamber when the semiconductor wafer is loaded into the measurement chamber, which as discussed above affects the accuracy of the measurement performed on the semiconductor wafer.

The semiconductor wafer mass metrology apparatus may further comprise a control unit configured to control an operation of the apparatus based on the sensed first temperature, and/or based on a change in the sensed first temperature.

For example, the control unit may be configured to generate an alert based on the sensed first temperature, and/or based on a change in the sensed first temperature.

For example, the apparatus may issue an alert when the sensed temperature of the first temperature changing part is greater than a predetermined value.

Alternatively, an alert may be generated when a change in the sensed temperature of the first temperature changing part is greater than a predetermined value.

The alert is to alert an operator of the apparatus, so that the operator is aware of the temperature/change in temperature.

The alert may be a visible and/or audible and/or tactile alert.

The present invention may comprise using a detected change in the sensed temperature of the first temperature changing part to calculate an incoming temperature of a wafer whose temperature was changed by the first temperature changing part. An alert may then be triggered when it is determined that the temperature of the incoming wafer is more than a predetermined threshold or less than a predetermined threshold. For example, this may indicate that a temperature changing step preceding the temperature change caused by the first temperature changing part is ineffective, such that the temperatures of semiconductor wafers incoming to the first temperature changing part are too high or too low (for the temperature of the first temperature changing part to remain substantially constant). For example, this may indicate that the second temperature changing part discussed above has failed (is broken or not working correctly).

The present inventors have discovered that there is a correlation between an error in a mass metrology measurement performed on a semiconductor wafer and a difference in temperature between a temperature of the first temperature changing part or semiconductor wafer before the semiconductor wafer is loaded into a measurement chamber and a temperature of the measurement chamber. Therefore, comparing the temperature of the first temperature changing part or the semiconductor wafer before the semiconductor wafer is loaded into the measurement chamber and the temperature of the measurement chamber provides useful information that can be used to improve the accuracy of the semiconductor wafer mass metrology.

Accordingly, the apparatus may further comprise a device or unit configured to determine a difference between the sensed first temperature and a second temperature that is a temperature of the measurement chamber.

The apparatus may further comprise a control unit configured to control an operation of the apparatus based on a difference between the sensed first temperature and the second temperature that is a temperature of the measurement chamber.

Alternatively, or in addition, the control unit may be configured to control an operation of a separate device or apparatus based on a difference between the sensed first temperature and a second temperature that is a temperature of the measurement chamber.

The apparatus may comprise a second temperature sensor configured to measure the second temperature of the measurement chamber.

The second temperature of the measurement chamber may be measured at the same time that the first temperature is measured.

Typically, both the first temperature and the second temperature will be measured at, or very soon after, the time that the semiconductor wafer leaves the first temperature changing device, and immediately before the semiconductor wafer is loaded in to the measurement chamber. In this case, the first temperature indicates the temperature of the semiconductor wafer when it is loaded into the measurement chamber.

Alternatively, the temperature of the measurement chamber may be precisely controlled to be a predetermined temperature, in which case the second temperature sensor may not be necessary.

The control unit may be a processor or a computer, for example.

As one example of the present invention, the control unit may be configured to generate an alert based on the difference between the first temperature and the second temperature.

For example, the apparatus may issue an alert when there is any difference between the first and second temperatures, or when a difference between the first and second temperatures is greater than a predetermined threshold.

The alert is to alert an operator of the apparatus, so that the operator is aware of the difference between the first and second temperatures.

The alert may be a visible and/or audible and/or tactile alert.

As an alternative, or in addition, the control unit may be configured to correct a mass measurement for the semiconductor wafer based on the difference between the first temperature and the second temperature and a predetermined relationship between the difference between the first temperature and the second temperature and a mass measurement error.

As discussed above, the present inventors have discovered that there is a correlation between an error in a mass metrology measurement performed on a semiconductor wafer and a difference in temperature between a temperature of the first temperature changing part or the semiconductor wafer before the semiconductor wafer is loaded into a measurement chamber and a temperature of the measurement chamber.

Thus, when this correlation is defined by the predetermined relationship, the difference between the first temperature and the second temperature and the predetermined relationship can be used to calculate or determine the corresponding error in the mass metrology measurement performed on the semiconductor wafer.

The predetermined relationship may be in the form of an equation, a function, a graph, a look up table or a database, for example.

The predetermined relationship may be derived from a plurality of mass metrology measurements for one or more semiconductor wafers for different differences between the first temperature and the second temperature, and a known mass of the semiconductor wafer.

The plurality of mass metrology measurements may be performed using the apparatus in question.

The predetermined relationship is typically stored in a memory of the apparatus.

In addition, or alternatively, where a second temperature changing unit is provided, the second temperature changing unit may be controlled based on the difference between the first temperature and the second temperature. For example, where the first temperature is greater than the second temperature, an amount of active cooling provided by the second temperature changing unit may be increased, for example to act to reduce the difference between the first temperature and the second temperature.

The first temperature changing part may comprise a first thermal transfer plate thermally coupled to the measurement chamber.

The first thermal transfer plate is typically a passive thermal transfer plate. Passive thermal transfer plate means that the thermal transfer plate is neither cooled nor heated by cooling/heating elements but rather receives its temperature by the surrounding ambient environment only.

The first thermal transfer plate may be substantially in thermal equilibrium with the measurement chamber. Here thermal equilibrium shall be defined as the temperature difference for the two elements is not more than 0.1° C.

The first thermal transfer plate is typically a plate or block of material having a high thermal mass. The first thermal transfer plate is typically a plate or block of material having a high thermal mass and high thermal conductivity.

For example, the first thermal transfer plate may be a plate or block of metal, such as aluminium.

The first thermal transfer plate may be provided on, or be integral with, an outer surface of the measurement chamber.

The first thermal transfer plate may be bolted to an outer surface of the measurement chamber, for example using bolts having a high thermal conductivity.

The first temperature sensor may be provided on, or inside, the first thermal transfer plate and sense a temperature of the thermal transfer plate. The first temperature sensor can be embedded in the first thermal transfer plate, e.g. beneath an external surface of the first thermal transfer plate.

The first temperature sensor may be embedded in the first thermal transfer plate at a distance between 1 to 18 mm from a semiconductor wafer supporting surface of the first thermal transfer plate. For example, the first temperature sensor may be embedded in the first thermal transfer plate at a distance between 2 to 12 mm from the semiconductor wafer supporting surface of the first thermal transfer plate. This may mean that the first temperature sensor accurately measures the temperature of the semiconductor wafer supporting surface that contacts the semiconductor wafer.

The apparatus may be configured to load the semiconductor wafer on to the thermal transfer plate for a predetermined period of time sufficient to achieve thermal equilibrium between the semiconductor wafer and the thermal transfer plate.

Alternatively, the output of the first temperature sensor may be used to determine a time required for achieving thermal equilibrium between the semiconductor wafer and the thermal transfer plate, and the time that the semiconductor wafer is positioned on the thermal transfer plate may be controlled accordingly. For example, the semiconductor wafer may be positioned on the thermal transfer plate for exactly the determined time, or for the determined time plus a predetermined amount. This may reduce the throughput time relative to the semiconductor wafer being positioned on the thermal transfer plate for a predetermined time.

Thus, the temperature of the semiconductor wafer is equalised to the temperature of the thermal transfer plate. Where the thermal transfer plate is usually substantially in thermal equilibrium with the measurement chamber, the temperature of the semiconductor wafer is therefore usually substantially equalised to the temperature of the measurement chamber, for a low heat load on the thermal transfer plate.

The apparatus may further comprise a clamping mechanism, for example a vacuum clamping mechanism, for clamping the semiconductor wafer to the thermal transfer plate.

The apparatus may further comprise sensing means/a sensing device or unit for sensing incomplete vacuum clamping of the semiconductor wafer to the thermal transfer plate. For example the sensing means/device or unit may be a sensor, for example that senses an incomplete vacuum.

If the semiconductor wafer is not properly clamped to the thermal transfer plate, the semiconductor wafer may not be properly cooled at the thermal transfer plate. Where the temperature of the thermal transfer plate is measured when the semiconductor wafer leaves the thermal transfer plate, the temperature of the semiconductor wafer may therefore be unknown (because it is not the same as the temperature of the thermal transfer plate), and the measurement error of the subsequent measurement of the semiconductor wafer may be unpredictable. In this case, the apparatus may generate an alert and not correct a measurement for the semiconductor wafer, since an appropriate amount of correction may be unpredictable.

The apparatus may therefore comprise a control unit that is configured to control an operation of the apparatus based on the output of the sensor for sensing incomplete vacuum clamping of the semiconductor wafer to the thermal transfer plate. For example, the control unit may control the apparatus to provide an alert to a user of the apparatus. The control unit may be the same as, or in addition to, any previously mentioned control unit.

The apparatus may comprise transport means/a transporter or transport device configured to directly transport semiconductor wafers from the first temperature changing unit to the measurement chamber. The term "directly" means without stopping at any additional units, for example without stopping at any further temperature changing units.

Of course, the present invention is not limited to providing only one or two temperature changing parts, and instead any number of temperature changing parts for causing any number of temperature changes of a semiconductor wafer may be provided. Thus, there may be a plurality of temperature changing parts for causing a sequence of a plurality of changes in the temperature of a semiconductor wafer.

According to a second aspect of the present invention there is provided a semiconductor wafer mass metrology method comprising:
  changing a temperature of a semiconductor wafer using a first temperature changing part before the semiconductor wafer is transported into a measurement chamber for measuring the weight and/or mass of the semiconductor wafer; and
  sensing a first temperature, wherein the first temperature is:
    a temperature of the first temperature changing part; or
    a temperature of the semiconductor wafer when the semiconductor wafer is on the first temperature changing part, or when the semiconductor wafer leaves the first temperature changing part.

The semiconductor wafer mass metrology method according to the second aspect of the present invention may comprise any one, or, where combinable, any combination of the optional features of the first aspect discussed above. Those optional features are not explicitly repeated here for conciseness.

The method according to the second aspect of the present invention may additionally, or alternatively, comprise any one, or, where combinable, any combination of the following optional features.

The temperature of the first temperature changing part may be measured when the semiconductor wafer is on the first temperature changing part, or when the semiconductor wafer leaves the first temperature changing part.

The method may comprise detecting:
  a change in the temperature of the first temperature changing part caused by the semiconductor wafer; and/or
  a maximum temperature of the first temperature changing part caused by the semiconductor wafer.

The method may further comprise changing the temperature of the semiconductor wafer using a second temperature changing part before the temperature of the semiconductor wafer is changed using the first temperature changing part.

The first temperature changing part may be for passively cooling the semiconductor wafer.

The second temperature changing part may be for actively cooling the semiconductor wafer.

However, as discussed above, either the first or second temperature changing parts may be for actively or passively heating or cooling the semiconductor wafer.

The method may comprise performing an operation based on the sensed first temperature and/or a change in the sensed first temperature, as discussed above in relation to the apparatus claims. For example, performing the operation may comprise generating an alert.

The method may comprise performing an operation based on a difference between the sensed first temperature and a second temperature that is a temperature of the measurement chamber.

The method may comprise, based on the difference between the first temperature and the second temperature:
  generating an alert; or
  correcting a mass measurement for the semiconductor wafer based on the difference between the first temperature and the second temperature and a predetermined relationship between the difference between the first temperature and the second temperature and a mass measurement error.

The predetermined relationship may be derived from a plurality of mass metrology measurements for one or more semiconductor wafers for different differences between the first temperature and the second temperature, and a known mass of the semiconductor wafer.

The temperature changing part may comprise a thermal transfer plate thermally coupled to the measurement chamber.

The method may comprise vacuum clamping the semiconductor wafer to the thermal transfer plate.

The method may further comprise sensing incomplete vacuum clamping of the semiconductor wafer to the thermal transfer plate.

The method may comprise performing an operation based on the sensing of the incomplete vacuum clamping of the semiconductor wafer to the thermal transfer plate. For example, performing an operation may comprise generating an alert.

BRIEF DESCRIPTION OF THE DRAWINGS

Embodiments of the present invention will now be discussed, by way of example only, with reference to the accompanying Figures, in which.

DETAILED DESCRIPTION OF THE PREFERRED EMBODIMENTS AND FURTHER OPTIONAL FEATURES OF THE INVENTION

Figure 1:
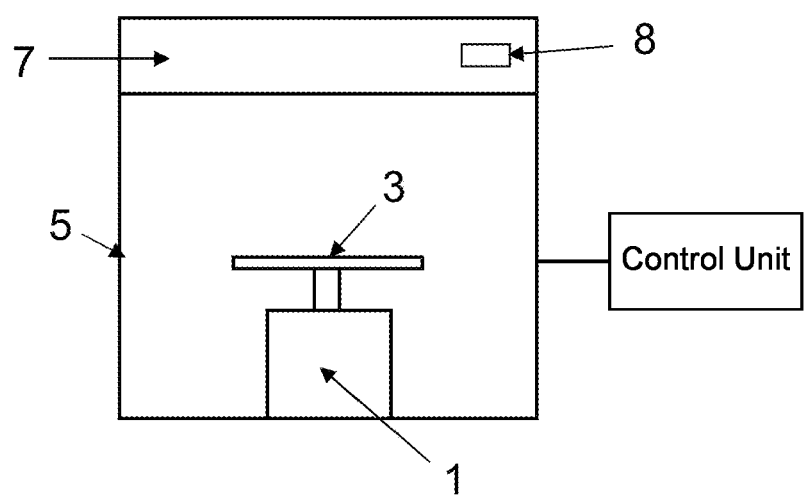
FIG. 1 shows a semiconductor wafer mass metrology apparatus according to a first embodiment of the present invention.

FIG. 1 shows a semiconductor wafer mass metrology apparatus according to a first embodiment of the present invention.

The semiconductor wafer mass metrology apparatus comprises a weighing balance 1 having a weighing pan 3 for receiving a semiconductor wafer. The weighing balance 1 is configured to provide measurement output indicative of the weight of a semiconductor wafer loaded on the weighing pan 3.

The weighing balance 1 is located within a weighing chamber 5 (a measurement chamber), which forms an enclosed environment around the weighing balance 1, e.g. to maintain a substantially uniform air density, air pressure and air temperature of the air around the weighing balance 1 and to prevent draughts and provide electromagnetic shielding. The weighing chamber 5 has an opening (not shown), e.g. a suitably sized slot in a side-wall of the weighing chamber 5, to allow a semiconductor wafer to be transported into the weighing chamber 5, e.g. by a robotic arm, and positioned on the weighing pan 3. When not in use, the opening may be covered by an openable door or covering (not shown) to allow the weighing chamber 5 to be substantially closed or sealed when performing measurements using the weighing balance 1.

A thermal transfer plate 7 (a "first temperature changing part") is positioned on top of the weighing chamber 5. The thermal transfer plate 7 comprises a block of material having a good thermal conductivity (for example Al). The thermal transfer plate also preferably has a high thermal mass, so that its temperature changes slowly and little when it is supplied with heat, and a good lateral thermal conductivity, so that it maintains a substantially uniform temperature across its upper surface. In this embodiment, the thermal transfer plate 7 is made from aluminium, but in other embodiments any other material with a good thermal conductivity may be used.

The thermal transfer plate 7 is positioned directly on top of the weighing chamber 5, so that there is a good thermal contact between the thermal transfer plate 7 and the weighing chamber 5. The thermal transfer plate 7 is in direct physical contact with the weighing chamber 5. The thermal transfer plate 7 may be attached or fixed to the weighing chamber 5, for example using one or more bolts (not shown) and/or a thermally conductive bonding layer (not shown).

As a result of the good thermal contact between the thermal transfer plate 7 and the weighing chamber 5, the thermal transfer plate 7 may usually be substantially in thermal equilibrium with the weighing chamber 5 and therefore may usually have substantially the same temperature as the weighing chamber 5 (when a heat load on the thermal transfer plate 7 is low). The weighing balance 1 may also be in thermal equilibrium with the weighing chamber 5 and therefore may also have substantially the same temperature as the weighing chamber 5. As such, the thermal transfer plate 7 may usually be substantially in thermal equilibrium with the weighing balance 1 and therefore may usually have substantially the same temperature as the weighing balance 1 (when a heat load on the thermal transfer plate 7 is low). However, as discussed below, when a thermal load on the thermal transfer plate 7 is high, the temperature of the thermal transfer plate 7 can diverge from the temperature of the weighing chamber 5.

In use, a semiconductor wafer to be measured is first positioned on the thermal transfer plate 7 to reduce its temperature. A vacuum clamping mechanism is provided to vacuum clamp the semiconductor wafer to the thermal transfer plate 7 in order to achieve a good thermal contact between the thermal transfer plate 7 and the semiconductor wafer, and thus thermal equilibrium can be achieved in a short time period (for example less than 0.01° C. temperature difference between the thermal transfer plate and the semiconductor wafer within 20 sec).

The semiconductor wafer is positioned on the thermal transfer plate 7 for a predetermined period of time sufficient to achieve thermal equilibrium between the semiconductor wafer and the thermal transfer plate 7. Usually the thermal transfer plate 7 and the weighing chamber 5 are in thermal equilibrium with each other (when a heat load on the thermal transfer plate 7 is low), such that the semiconductor wafer is brought to the same temperature as the temperature of the weighing chamber 5.

After the semiconductor wafer has been cooled by the thermal transfer plate 7 it is transported from the thermal transfer plate 7 into the weighing chamber 5 and positioned on the weighing pan 3 of the weighing device 1, for measurement.

The semiconductor wafer is directly transported from the thermal transfer plate 7 into the weighing chamber 5, for example without visiting any intermediate temperature changing units. In particular, the apparatus comprises a transport mechanism (not illustrated) that is configured to transport the semiconductor wafer directly from the thermal transfer plate 7 into the weighing chamber 5.

Of course, in other embodiments the thermal transfer plate 7 may be located in a different position relative to the weighing chamber 5.

As shown in FIG. 1, the thermal transfer plate 7 has a first temperature sensor 8 embedded therein, for measuring a temperature of the thermal transfer plate 7. As discussed below, the first temperature sensor 8 can be used to measure a temperature of the thermal transfer plate 7 while the semiconductor wafer is on the thermal transfer plate 7, or at the moment the semiconductor wafer leaves the thermal transfer plate 7 after it has been cooled. The advantages of providing the first temperature sensor 8 are discussed below following the discussions of the second and third embodiments.

Other features of the first embodiment will be discussed later following the discussion of the second and third embodiments.

Figure 2:
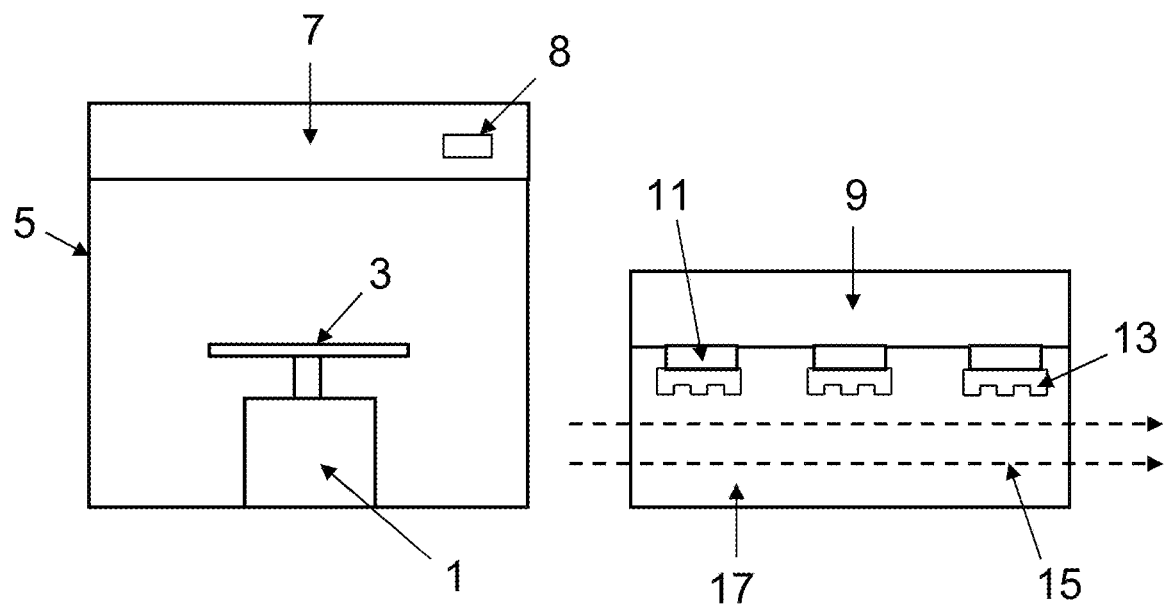
FIG. 2 shows a semiconductor wafer mass metrology apparatus according to a second embodiment of the present invention.

FIG. 2 shows a semiconductor wafer mass metrology apparatus according to a second embodiment of the present invention.

The semiconductor wafer mass metrology apparatus of FIG. 2 differs from the semiconductor wafer mass metrology apparatus of FIG. 1 in that it further comprises a second thermal transfer plate 9 (a "second temperature changing part"). A plurality of Peltier devices 11 are attached to a bottom side of the second thermal transfer plate 9. Each Peltier device 11 has a heat sink 13 attached to the bottom side thereof. An air flow 15 can be provided in a region 17 beneath the bottom side of the second thermal transfer plate 9 in order to remove heat from the Peltier devices 11 and from the heat-sinks 13. Of course, the configuration of the air flow may be different to that shown in FIG. 2. For example, air may be blown out of the bottom the region 17 by a fan.

In FIG. 2 the second thermal transfer plate 9 is shown as being positioned to the right-hand side of the weighing chamber 5. However, in other embodiments the second thermal transfer plate 9 can be positioned differently, for example to a different side, above or below the weighing chamber 5, or closer or further away from the weighing chamber 5 than illustrated in FIG. 2. In other embodiments, the second thermal transfer plate 9 may be attached or connected, directly or indirectly, to the thermal transfer plate 7.

In use, a wafer transporter, for example an end effector of a robotic arm of an EFEM, is used to remove a semiconductor wafer from a FOUP (not shown), or alternatively from another processing apparatus (not shown), and to transport the semiconductor wafer to the second thermal transfer plate 9 and position the semiconductor wafer on the second thermal transfer plate 9. When the semiconductor wafer is removed from the FOUP (or the other processing apparatus) it may have a temperature of approximately 70° C. For example, the semiconductor wafer may have been processed at a processing station of a semiconductor device production line, which may have heated the semiconductor wafer to a temperature of 400 to 500° C., before the semiconductor wafer was loaded into the FOUP.

When the semiconductor wafer is positioned on the second thermal transfer plate 9, heat is conducted from the semiconductor wafer to the second thermal transfer plate 9 so that the temperature of the semiconductor wafer is decreased. Depending on how long the semiconductor wafer is positioned on the second thermal transfer plate 9, the semiconductor wafer and the second thermal transfer plate 9 may achieve thermal equilibrium (e.g. so that they have substantially the same temperature). Transfer of heat from the semiconductor wafer to the second thermal transfer plate 9 would act to increase the temperature of the second thermal transfer plate 9. In that case, the thermal equilibrium temperature of the semiconductor wafer and the second thermal transfer plate 9 may be different to a desired temperature of the semiconductor wafer. In order to prevent the temperature of the second thermal transfer plate 9 from increasing due to the heat load from the semiconductor wafer, the second thermal transfer plate 9 is operable to actively dissipate the heat load removed from the semiconductor wafer. In particular, the Peltier devices 11 are operated to actively remove heat from the second thermal transfer plate 9. In other words, electrical power is supplied to the Peltier devices 11 to cause them to act as active heat pumps that transfer heat from their upper surfaces in contact with the second thermal transfer plate 9 to their lower surfaces to which the heat-sinks 13 are attached.

An air-flow 15 is provided in the region 17 beneath the second thermal transfer plate 9 in which the Peltier devices 11 and the heat-sinks 13 are positioned in order to remove heat from the Peltier devices 11 and the heat-sinks 13. The heat removed from the semiconductor wafer using the second thermal transfer plate 9 is therefore transported and dissipated away from the weighing chamber 5 of the weighing apparatus by the air-flow 15, so that this heat has no effect on the temperature of the weighing apparatus. The air-flow 15 may be generated by one or more fans, for example posited in, or at the edges of, the region 17. In other words, heat is actively dissipated from the second thermal transfer plate 9.

As mentioned above, actively dissipating heat from the second thermal transfer plate 9 will prevent heat from building up in the second thermal transfer plate 9, which would cause an increase in the temperature of the second thermal transfer plate 9. In this embodiment, the heat removed from the semiconductor wafer is effectively/efficiently disposed of by being dissipated by the second thermal transfer plate 9. This may enable the temperature of the semiconductor wafer to be more precisely/accurately controlled using the second thermal transfer plate 9.

The second thermal transfer plate 9 is operated to remove a bulk of a heat load from the semiconductor wafer, so that the temperature of the semiconductor wafer is reduced to close to the desired temperature of the semiconductor wafer when it is positioned on the weighing pan 3. The second thermal transfer plate 9 may remove over 90%, or over 95%, or over 99%, of the heat that needs to be removed to reduce the temperature of the semiconductor wafer to the desired temperature. Put another way, the second thermal transfer plate 9 may cause over 90%, or over 95%, or over 99%, of the temperature change required to decrease the temperature of the semiconductor wafer from its initial temperature to the desired temperature when it is positioned on the weighing pan 3.

Typically, it is desired to substantially match the temperature of the semiconductor wafer to the temperature of the weighing chamber 5, so that there is substantially no temperature difference between the semiconductor wafer and the weighing chamber 5 (and therefore substantially no temperature difference between the semiconductor wafer and the weighing balance 1) when the semiconductor wafer is loaded on the weighing pan 3. In this embodiment, the second thermal transfer plate 9 may cool the semiconductor wafer to within ±1° C. of the temperature of weighing chamber 5. For example, where the weighing chamber has a temperature of 20° C., the second thermal transfer plate 9 may cool the semiconductor wafer to a temperature of (20±1)° C. However, in other embodiments the amount of cooling provided by the second thermal transfer plate 9 may be different to this, provided that as a minimum the second thermal transfer plate 9 provides over 50% of the required temperature change of the semiconductor wafer, and preferably over 80%.

Once the semiconductor wafer has been cooled to a temperature close to the desired temperature using the second thermal transfer plate 9, it is transported to the first thermal transfer plate 7 using a wafer transporter. Preferably, a different wafer transporter is used to transport the semiconductor wafer to the first thermal transfer plate 7 than was used to transport the semiconductor wafer to the second thermal transfer plate 9. In this embodiment, two different end effectors of a robotic arm of an EFEM are used to perform the two different transportation steps. The end effector that transports the semiconductor wafer to the second thermal transfer plate 9 may be heated by the semiconductor wafer 9. If the same end effector is used to transport the cooled semiconductor wafer from the second thermal transfer plate 9 to the thermal transfer plate 7 it may transfer heat back to the semiconductor wafer, thereby changing its temperature. This problem may be avoided by using a different end effector for the second transportation step. An end effector may be a surface on which the semiconductor wafer can be supported, for example a support that is positioned underneath the semiconductor wafer. An end effector may have some means/device/unit for gripping or clamping the semiconductor wafer in position while it is being transported by the end effector.

The end effector(s) may be configured so that there is a minimal or reduced thermal contact area between the end effector(s) and the semiconductor wafer, in order to minimise heat transfer between the end effector(s) and the semiconductor wafer. For example, the end effector(s) may contact the semiconductor wafer solely at the edge of the semiconductor wafer. Alternatively, or in addition, the end effector(s) may be made out of a material(s) with a poor thermal conductivity, i.e. a thermal insulator, to minimise heat transfer between the end effector(s) and the semiconductor wafer.

As discussed above, when the semiconductor wafer is positioned on the thermal transfer plate 7 there is good thermal contact between the semiconductor wafer and the thermal transfer plate 7. Therefore, the semiconductor wafer is cooled by heat being conducted from the semiconductor wafer to the thermal transfer plate 7. Depending on the length of time that the semiconductor wafer is positioned on the thermal transfer plate 7, the semiconductor wafer and the thermal transfer plate 7 may become substantially in thermal equilibrium, so that they have substantially the same temperature. In this embodiment, the semiconductor wafer may be positioned on the thermal transfer plate 7 for a period sufficient to achieve thermal equilibrium, for example 60 seconds.

The semiconductor wafer has already had the bulk of its heat load removed by the second thermal transfer plate 9 before it is positioned on the thermal transfer plate 7. Therefore, the thermal load on the thermal transfer plate 7 during the temperature equalisation is very low, and the temperature of the thermal transfer plate 7 and the weighing chamber 5 (which have a high thermal mass) may therefore remain substantially constant during the temperature equalisation (when a heat load on the thermal transfer plate 7 is low). In addition, relatively little heat has to be exchanged to bring the semiconductor wafer into thermal equilibrium with the thermal transfer plate 7. However, where many semiconductor wafers are being measured the heat load on the thermal transfer plate may still be sufficient to cause a small divergence of the temperature of the thermal transfer plate 7 from the temperature of the weighing chamber 5.

Therefore, with the present embodiment it may be possible to more accurately/precisely equalise the temperature of the semiconductor wafer to the desired temperature, because the steps of removing the bulk of the heat load from the semiconductor wafer and equalising the temperature of the semiconductor wafer have been separated. For example with the present embodiment it may be possible to match the temperature of the semiconductor wafer to the temperature of the weighing chamber 5 to an accuracy of less than 0.1° C., or to an accuracy of less than 0.01° C., or even to an accuracy of the order of 0.001° C.

When the temperature of the semiconductor wafer is substantially equalised to the temperature of the thermal transfer plate 7 (e.g. when the semiconductor wafer has been on the thermal transfer plate 7 for a predetermined period of time) the semiconductor wafer is transported by a wafer transporter from the thermal transfer plate 7 to the weighing pan 3. The weighing balance 1 is then used to provide measurement output indicative of the weight of the semiconductor wafer.

As with the first embodiment, a first temperature sensor 8 is embedded in the thermal transfer plate 7 to measure a temperature of the thermal transfer plate 7. The advantages of providing such a first temperature sensor 8 are discussed below following the discussion of the third embodiment.

Further features of the second embodiment of the present invention are discussed below following the discussion of the third embodiment.

Figure 3:
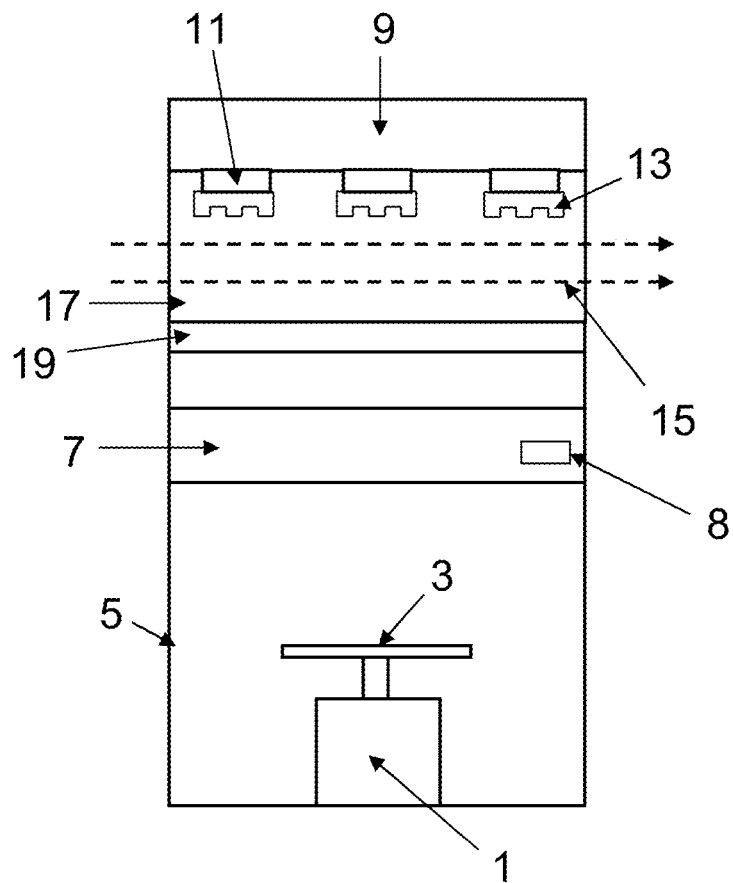
FIG. 3 shows a semiconductor wafer mass metrology apparatus according to a third embodiment of the present invention.

FIG. 3 shows a semiconductor wafer mass metrology apparatus according to a third embodiment of the present invention.

The primary difference between the second and third embodiments is the positioning of the second thermal transfer plate 9. In the third embodiment, the second thermal transfer plate 9 is stacked above the thermal transfer plate 7. A thermal gap 19, for example an air gap or a layer of insulating material, is positioned between the thermal transfer plate 7 and the second thermal transfer plate 9, so that the thermal transfer plates 7, 9 are substantially thermally insulated from each other so that substantially no heat can pass between the thermal transfer plates 7, 9.

Floor space is often limited in semiconductor device production facilities. Therefore, it may be advantageous to stack the second thermal transfer plate 9 above the thermal transfer plate 7, i.e. similarly to the arrangement shown in FIG. 3, in order to save floor space. In this arrangement, the semiconductor wafer is transported vertically between the thermal transfer plates 7, 9 and the weighing pan 3.

Further features of the first to third embodiments of the present invention are discussed below.

The arrangements illustrated in FIGS. 1 to 3 are illustrative arrangements only, and other configurations of the measurement chamber and temperature changing parts are possible in the present invention and will be apparent to the skilled person from the above disclosure.

Furthermore, in other embodiments the thermal transfer plates 7, 9 may be replaced with other types of temperature changing part that actively or passively heat or cool the semiconductor wafers.

As discussed above, the present inventors have realised that in any of the embodiments discussed above, and in other possible embodiments, the temperature of the thermal transfer plate 7 can diverge from the temperature of the weighing chamber 5 over time when measuring a sequence of semiconductor wafers, such that the temperatures are not the same. This temperature difference can cause subsequent errors in the mass measurements for the semiconductor wafers (as discussed in more detail below).

Therefore, in embodiments of the present invention a temperature sensor is provided to measure either a temperature of the thermal transfer plate 7, or a temperature of the semiconductor wafer when the semiconductor wafer is on the first temperature changing part or when the semiconductor wafer leaves the first temperature changing part.

In FIGS. 1 to 3 the temperature sensor 8 is shown as being embedded in the thermal transfer plate 7, so as to measure a temperature of the thermal transfer plate 7. However, the temperature sensor may alternatively be provided on a surface of the thermal transfer plate 7. In another embodiment, the temperature sensor may be a non-contact temperature sensor that is not in direct contact with the thermal transfer plate 7, for example an IR based temperature sensor.

Figure 4:
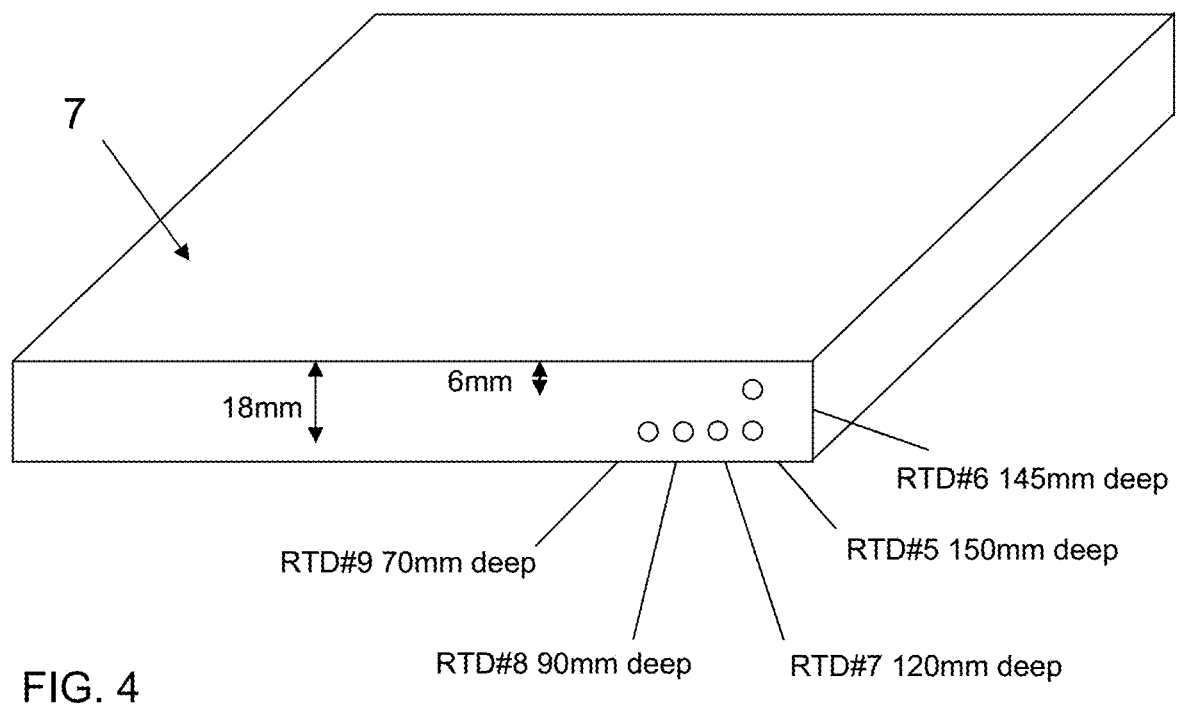
FIG. 4 shows a schematic configuration of a passive thermal transfer plate in some embodiments of the present invention.

FIG. 4 shows a schematic view of an example of a thermal transfer plate 7 according to an example embodiment of the present invention. In FIG. 4 a number of different temperature sensors have been provided in various different positions on the thermal transfer plate 7, to illustrate measurement of the temperature of the thermal transfer plate 7. Specifically, temperature sensors RTD#5 to RTD#9 have been provided at different depths and heights inside the thermal transfer plate 7. In practice, only a single temperature sensor may be provided.

Multiple temperature sensors are provided in FIG. 4 to illustrate the effect of the position of the temperature sensor on the temperature measurement by the temperature sensor. In practice however only a single temperature sensor will be provided, or a small number of temperature sensors. For example, a single temperature sensor may be provided as close as practically possible to a wafer supporting surface of the semiconductor wafer.

Figure 5:
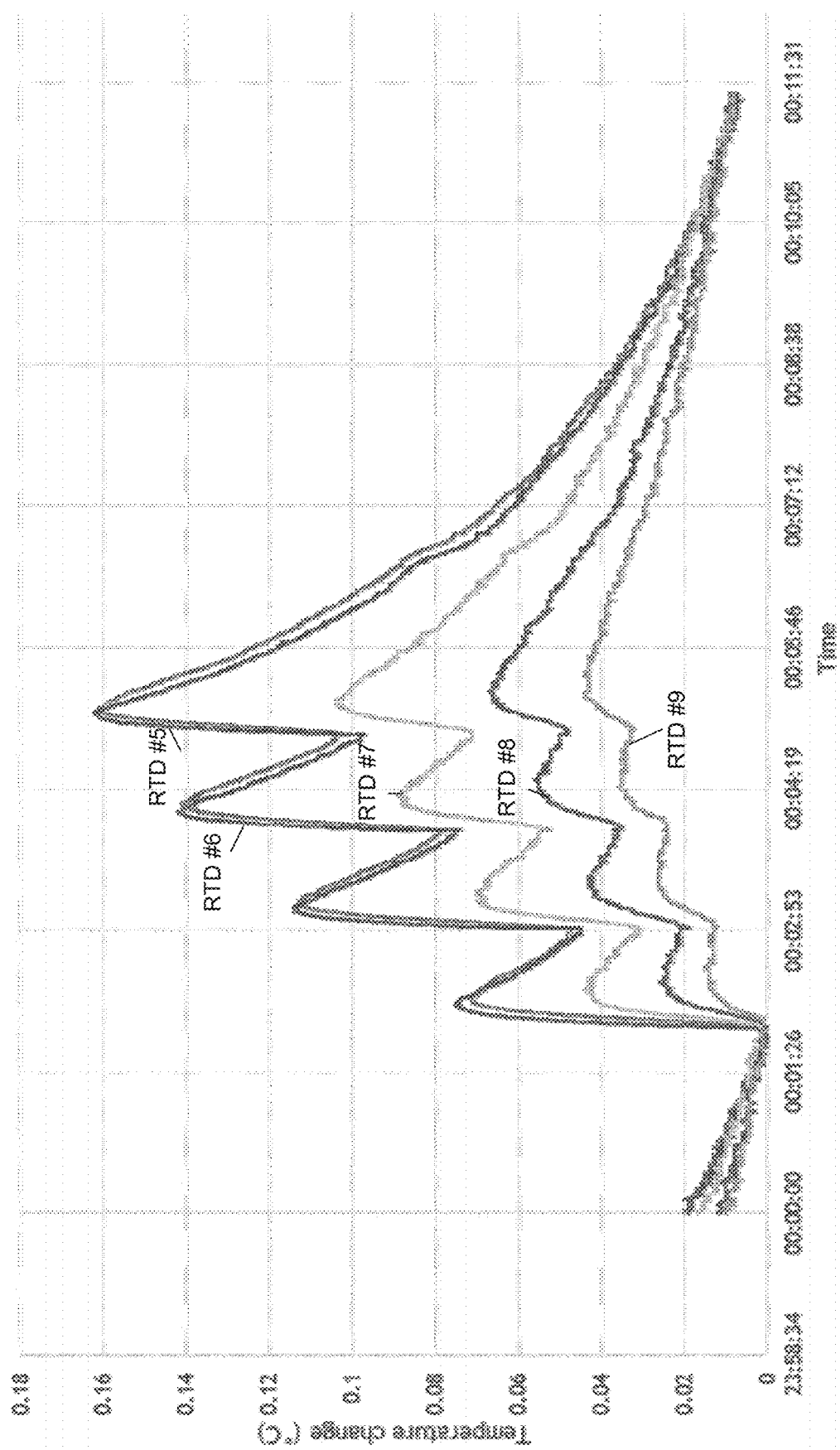
FIG. 5 is a graph showing temperature variations measured by different temperature sensors in the thermal transfer plate of FIG. 4.

FIG. 5 shows temperatures measured by the temperature sensors RTD#5 to RTD#9 over time as a series of hot semiconductor wafers are loaded on to the thermal transfer plate 7 sequentially in advance of measurement. As shown in FIG. 5, the temperature of the thermal transfer plate 7 increases over time as the series of hot semiconductor wafers are loaded on to the thermal transfer plate 7, due to the high thermal load on the thermal transfer plate 7.

This rapid increase in the temperature of the thermal transfer plate 7 may mean that the temperature of the thermal transfer plate 7 diverges from the temperature of the measurement chamber, leading to the subsequent errors in the mass measurements discussed above. This divergence, and the subsequent errors, will be greater in the embodiment of FIG. 1 than in the embodiments of FIGS. 2 and 3, due to the greater thermal load on the thermal transfer plate 7 in the embodiment of FIG. 1.

Furthermore, the graph in FIG. 5 shows that the temperature of the thermal transfer plate changes as a semiconductor wafer is positioned on the thermal transfer plate 7, and that in particular while a semiconductor wafer is on the thermal transfer plate 7 there is a peak or spike in the temperature of the thermal transfer plate 7 caused by the difference in temperature between the semiconductor wafer and the thermal transfer plate 7.

In some embodiments of the present invention this peak/spike may be detected or measured for each semiconductor wafer and this information may be used to calculate a temperature of the semiconductor wafer when it arrives at the thermal transfer plate 7. As discussed below, an operation of the apparatus or of a separate device may then be controlled based on the calculated temperature of the incoming wafers.

Figure 6:
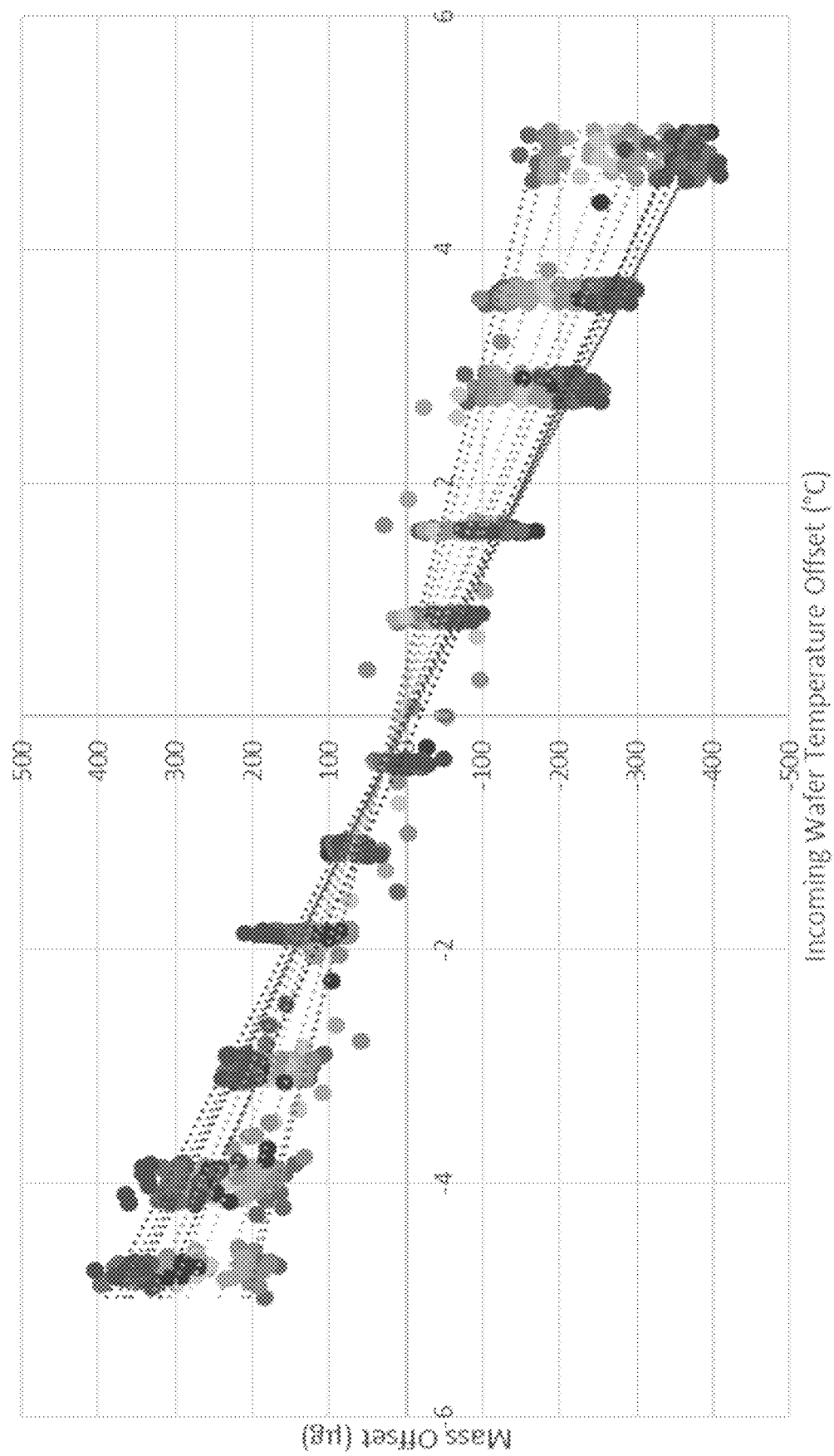
FIG. 6 is a graph showing errors in mass measurement against incoming wafer temperature offset.

FIG. 6 is a graph of experimental data illustrating an error in the subsequent mass measurement for semiconductor wafers, against difference between the initial temperature of the semiconductor wafer when it is placed on the thermal transfer plate 7 and a temperature of the measurement chamber at the sample time.

It is clear from FIG. 6 that when there is a large difference between the temperature of the semiconductor wafer when it is placed on the thermal transfer plate 7 and a temperature of the measurement chamber at the sample time, this can cause significant errors in the subsequent mass measurement. This is due to the large thermal load on the thermal transfer plate 7 causing the temperature of the thermal transfer plate 7 to diverge from the temperature of the measurement chamber over time.

The different dotted lines in FIG. 6 illustrate data from different semiconductor wafers. The data was obtained by heating or cooling the different semiconductor wafers to a range of different temperatures relative to the temperature of the measurement chamber before passing the semiconductor wafer to the thermal transfer plate 7 in advance of measurement in the measurement chamber.

Figure 7:
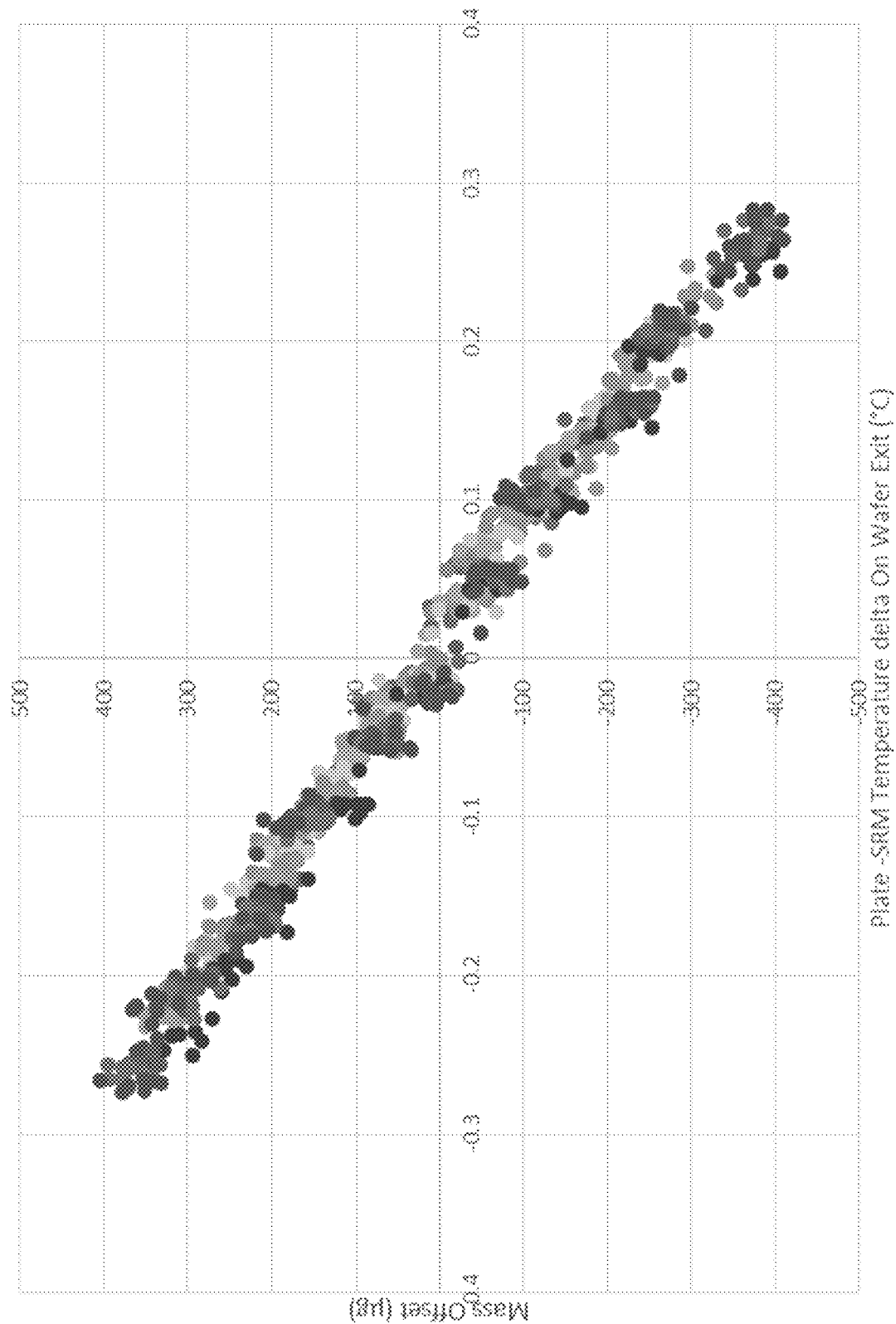
FIG. 7 is a graph showing errors in mass measurement against the difference between the temperature of the thermal transfer plate and the temperature of the measurement chamber at the moment that the semiconductor wafer exits the thermal transfer plate.

FIG. 7 is a graph of experimental data for the same semiconductor wafers as FIG. 6 illustrating a relationship between the mass error in the subsequent measurement and the temperature difference between the thermal transfer plate 7 and the weighing chamber 5 at the moment the semiconductor wafer leaves the thermal transfer plate 7.

As can be seen from FIG. 7, there is a correlation between the mass error in the subsequent measurement and the temperature difference between the thermal transfer plate 7 and the weighing chamber 5 at the moment the semiconductor wafer leaves the thermal transfer plate 7. In particular, there is a linear (straight line) relationship.

Thus, where this correlation is known, e.g. from previously performed experiments, it is possible to determine an error in a subsequent mass measurement performed for a semiconductor wafer from the temperature difference between the thermal transfer plate 7 and the weighing chamber 5 at the moment the semiconductor wafer leaves the thermal transfer plate 7.

Figure 8:
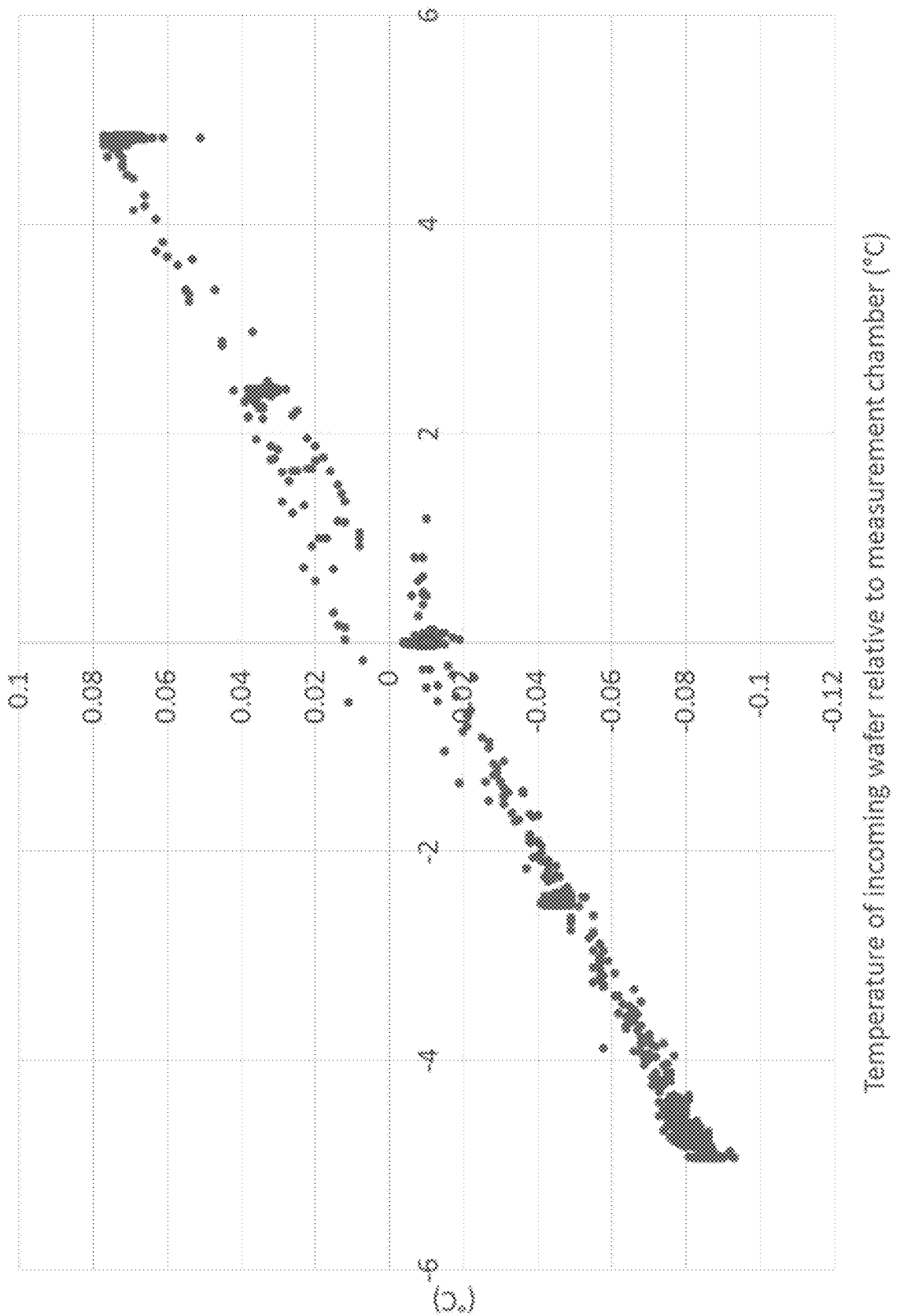
FIG. 8 is a graph showing the maximum temperature change of the thermal transfer plate while the semiconductor wafer is on the thermal transfer plate against the temperature difference between the incoming temperature of the semiconductor wafer and the temperature of the measurement chamber.

FIG. 8 is a graph showing the maximum temperature change of the thermal transfer plate 7 while the semiconductor wafer is on the thermal transfer plate 7 against the temperature difference between the incoming temperature of the semiconductor wafer and the temperature of the measurement chamber. As shown in FIG. 8, the maximum temperature change of the thermal transfer plate 7 while the semiconductor wafer is on the thermal transfer plate 7 correlates with the temperature difference between the incoming temperature of the semiconductor wafer and the temperature of the measurement chamber (the line on the graph is a straight line). Therefore, in embodiments of the present invention the maximum temperature change of the thermal transfer plate 7 while the semiconductor wafer is on the thermal transfer plate 7 is detected or measured, and this information is used to determine a difference in temperature between the incoming temperature of the semiconductor wafer and the temperature of the measurement chamber, using a predetermined relationship such as that illustrated in FIG. 8.

Although the temperature of the thermal transfer plate 7 is measured in the above examples, in other embodiments the temperature of the semiconductor wafer itself may be measured directly.

In some embodiments of the present invention, a second temperature sensor is provided to measure the temperature of the weighing chamber 5. Alternatively, the temperature of the weighing chamber 5 may be precisely controlled to be a particular temperature, such that the second temperature sensor is unnecessary.

In some embodiments the apparatus is provided with a control unit that compares the measured temperature of the thermal transfer plate 7 (or the semiconductor wafer) with the measured or known temperature of the weighing chamber 5. For example, the control unit may calculate a difference between these temperatures by subtraction.

Based on this comparison, the control unit may then control an operation of the apparatus or of a separate device or apparatus.

In a first example, where the temperature of the thermal transfer plate 7 is not the same as the temperature of the weighing chamber 5, or where the temperatures differ by more than a predetermined amount, the control unit may be configured to provide an alert.

For example, the apparatus may have a display on which a visual alert is displayed. Alternatively the apparatus may have a speaker though which an audible alert is provided.

The alert alerts an operator of the device that the mass measurement may be erroneous.

In a second example, the control unit may be configured to correct a mass measurement for the semiconductor wafer based on the comparison. In particular, the control unit may store in a memory a predetermined relationship between the mass measurement error and the difference in temperature between the thermal transfer plate 7 (or the semiconductor wafer) and the temperature of the weighing chamber 5. Thus, by inputting the temperature difference between the temperature of the thermal transfer plate 7 (or the semiconductor wafer) and the temperature of the weighing chamber 5 at the moment the semiconductor wafer leaves the thermal transfer plate 7 into the predetermined relationship, the expected mass measurement error can be output and then used to correct the mass measurement for the semiconductor wafer.

The predetermined relationship may be determined based on experimental data such as that illustrated in FIG. 7 obtained by performing multiple mass measurements for semiconductor wafers with different differences between the temperature of the thermal transfer plate 7 (or the semiconductor wafer) and the temperature of the weighing chamber 5 at the moment the semiconductor wafer leaves the thermal transfer plate 7. For example, the predetermined relationship may be the equation of the linear relationship in FIG. 7, or may alternatively be a look up table of some other relationship.

Correcting the mass measurement in this manner means that hotter wafers can be passed directly to the thermal transfer plate 7 than would previously be possible, because the errors caused by the large temperature offset can be corrected. This means that in some embodiments the apparatus may not require the provision of the second thermal transfer plate 9 of FIGS. 2 and 3. Such an active thermal transfer plate 9 is an expensive component, and therefore the apparatus will be more cost effective if this component can be omitted, while still maintaining suitable accuracy due to the correction of the subsequent measurement errors.

For the highest accuracy the second thermal transfer plate 9 can additionally be provided as in FIGS. 2 and 3.

In an alternative embodiment where the second thermal transfer plate 9 is provided, the determined difference between the thermal transfer plate 7 (or the semiconductor wafer) and the temperature of the weighing chamber 5 at the moment the semiconductor wafer leaves the thermal transfer plate 7 can be used to change an operation of the second thermal transfer plate 9. For example, where it is determined that the temperature of the second thermal transfer plate 9 is greater than the temperature of the weighing chamber 5, an amount of cooling provided by the active thermal transfer plate 9 may be increased so as to reduce the downstream difference in temperature between the thermal transfer plate 7 (or the semiconductor wafer) and the temperature of the weighing chamber 5.

In addition, or alternatively, in embodiments of the present invention a maximum temperature change of the thermal transfer plate 7 while the semiconductor wafer is on the thermal transfer plate 7 may be measured, and this information may instead be used to control an operation of the second thermal transfer plate, for example an amount of cooling provided by the active thermal transfer plate 9 may be increased so as to decrease the subsequent temperature change of the thermal transfer plate 7 when the semiconductor wafer is placed on the thermal transfer plate 7.

Of course, the options discussed above are not mutually exclusive, and can be combined in any order. For example, the control unit may be configured to correct the mass measurement for the semiconductor wafer and to control the operation of the second thermal transfer plate, or to provide an alert and control the operation of the second thermal transfer plate, or provide an alert and correct the mass measurement for the semiconductor wafer, etc.

As mentioned above, the apparatus may comprise a vacuum clamping mechanism to vacuum clamp the semiconductor wafers to the thermal transfer plate 7, so as to ensure thermal contact. However, wafers that are significantly bowed will not be properly clamped to the thermal transfer plate 7 and therefore will not achieve thermal equilibrium with the thermal transfer plate 7 in the provided time.

A sensor or other detecting means/device/unit may therefore be provided to detect incomplete vacuum clamping of the semiconductor wafer to the thermal transfer plate 7. Where incomplete vacuum clamping is detected, and the temperature of the thermal transfer plate 7 is being measured, then determination of the error in the mass measurement is not possible, because the temperature of the semiconductor wafer is not known. Therefore, when incomplete vacuum clamping is detected, the apparatus may be configured to not correct the mass measurement and instead to issue an alert.

The apparatus may be configured to perform an operation, for example generating an alert, when incomplete vacuum clamping is detected.

Of course, in other embodiments of the present invention other types of temperature changing part(s) may be provided instead of the thermal transfer plates of the embodiments discussed above.

The invention claimed is:

1. A semiconductor wafer mass metrology apparatus comprising:
   a measurement chamber for measuring a weight and/or a mass of a semiconductor wafer;
   a first temperature changing part for changing a temperature of the semiconductor wafer before the semiconductor wafer is transported into the measurement chamber; and
   a first temperature sensor for sensing a first temperature, wherein the first temperature is
   a temperature of the first temperature changing part;
   wherein the first temperature changing part is for passively cooling the semiconductor wafer or for passively heating the semiconductor wafer.

2. The semiconductor wafer mass metrology apparatus according to claim 1, wherein the first temperature changing part is for passively cooling the semiconductor wafer.

3. The semiconductor wafer mass metrology apparatus according to claim 1, wherein the apparatus further comprises a second temperature changing part for actively cooling the semiconductor wafer.

4. The semiconductor wafer mass metrology apparatus according to claim 1, wherein the temperature of the first temperature changing part is measured when the semiconductor wafer is on the first temperature changing part, or when the semiconductor wafer leaves the first temperature changing part.

5. The semiconductor wafer mass metrology apparatus according to claim 1, wherein the first temperature sensor is configured to detect:

a change in the temperature of the first temperature changing part caused by the semiconductor wafer; and/or a maximum temperature of the first temperature changing part caused by the semiconductor wafer.

6. The semiconductor wafer mass metrology apparatus according to claim 1, wherein the apparatus further comprises a control unit configured to control an operation of the apparatus based on:
the sensed first temperature; and/or
a change in the sensed first temperature; and/or
a difference between the sensed first temperature and a second temperature that is a temperature of the measurement chamber.

7. The semiconductor wafer mass metrology apparatus according to claim 6, wherein the control unit is configured to:
generate an alert; and/or
correct a mass measurement for the semiconductor wafer based on the difference between the first temperature and the second temperature and a predetermined relationship between the difference between the first temperature and the second temperature and a mass measurement error.

8. The semiconductor wafer mass metrology apparatus according to claim 7, wherein the predetermined relationship is derived from a plurality of mass metrology measurements for one or more semiconductor wafers for different differences between the first temperature and the second temperature, and a known mass of the semiconductor wafer.

9. The semiconductor wafer mass metrology apparatus according to claim 1, wherein the first temperature changing part comprises a first thermal transfer plate thermally coupled to the measurement chamber.

10. The semiconductor wafer mass metrology apparatus according to claim 9, wherein the apparatus is configured to load the semiconductor wafer on to the first thermal transfer plate for a predetermined period of time sufficient to achieve thermal equilibrium between the semiconductor wafer and the first thermal transfer plate.

11. The semiconductor wafer mass metrology apparatus according to claim 1, wherein:
the first temperature changing part comprises a first thermal transfer plate; and
the first temperature sensor is embedded in the first thermal transfer plate.

12. The semiconductor wafer mass metrology apparatus according to claim 11, wherein the first temperature sensor is embedded in the first thermal transfer plate at a distance between 1 to 18 mm from a semiconductor wafer supporting surface of the first thermal transfer plate, wherein the distance is optionally between 2 to 12 mm.

13. A semiconductor wafer mass metrology method comprising:
changing a temperature of a semiconductor wafer using a first temperature changing part before the semiconductor wafer is transported into a measurement chamber for measuring a weight and/or a mass of the semiconductor wafer; and
sensing a first temperature, wherein the first temperature is
a temperature of the first temperature changing part, wherein the first temperature changing part is for passively cooling the semiconductor wafer or for passively heating the semiconductor wafer.

14. The semiconductor wafer mass metrology method according to claim 13, wherein the temperature of the first temperature changing part is measured when the semiconductor wafer is on the first temperature changing part, or when the semiconductor wafer leaves the first temperature changing part.

15. The semiconductor wafer mass metrology method according to claim 13, wherein the method comprises detecting:
a change in the temperature of the first temperature changing part caused by the semiconductor wafer; and/or
a maximum temperature of the first temperature changing part caused by the semiconductor wafer.

16. The semiconductor wafer mass metrology method according to claim 13, wherein:
the method further comprises changing the temperature of the semiconductor wafer using a second temperature changing part before the temperature of the semiconductor wafer is changed using the first temperature changing part;
the first temperature changing part is for passively cooling the semiconductor wafer; and
the second temperature changing part is for actively cooling the semiconductor wafer.

17. The semiconductor wafer mass metrology method according to claim 13, wherein the method further comprises performing an operation based on:
the sensed first temperature; and/or
a change in the sensed first temperature; and/or
a difference between the sensed first temperature and a second temperature that is a temperature of the measurement chamber.

18. The semiconductor wafer mass metrology method according to claim 17, wherein performing the operation comprises:
generating an alert; or
correcting a mass measurement for the semiconductor wafer based on the difference between the first temperature and the second temperature and a predetermined relationship between the difference between the first temperature and the second temperature and a mass measurement error.

19. The semiconductor wafer mass metrology method according to claim 18, wherein the predetermined relationship is derived from a plurality of mass metrology measurements for one or more semiconductor wafers for different differences between the first temperature and the second temperature, and a known mass of the semiconductor wafer.

20. The semiconductor wafer mass metrology method according to claim 13, wherein the first temperature changing part comprises a thermal transfer plate thermally coupled to the measurement chamber.

21. The semiconductor wafer mass metrology method according to claim 13, wherein:
the method comprises vacuum clamping the semiconductor wafer to the thermal transfer plate;
sensing incomplete vacuum clamping of the semiconductor wafer to the thermal transfer plate; and
performing an operation based on the sensing of the incomplete vacuum clamping of the semiconductor wafer to the thermal transfer plate.

* * * * *